(12) United States Patent
Lysejko et al.

(10) Patent No.: US 10,667,145 B2
(45) Date of Patent: May 26, 2020

(54) BEARING CALCULATION

(71) Applicant: Airspan Networks Inc., Boca Raton, FL (US)

(72) Inventors: Martin Lysejko, Bagshot (GB); Andrew Logothetis, High Wycombe (GB)

(73) Assignee: Airspan Networks Inc., Boca Raton, FL (US)

(*) Notice: Subject to any disclaimer, the term of this patent is extended or adjusted under 35 U.S.C. 154(b) by 918 days.

(21) Appl. No.: 15/186,900

(22) Filed: Jun. 20, 2016

(65) Prior Publication Data
US 2016/0377695 A1 Dec. 29, 2016

(30) Foreign Application Priority Data

Jun. 25, 2015 (GB) .................................. 1511200.6
Aug. 21, 2015 (GB) .................................. 1514938.8

(51) Int. Cl.
*H04W 72/08* (2009.01)
*H04W 88/04* (2009.01)
(Continued)

(52) U.S. Cl.
CPC ............ *H04W 24/02* (2013.01); *F16M 11/06* (2013.01); *G01S 3/043* (2013.01); *G01S 3/14* (2013.01); *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01);
(Continued)

(58) Field of Classification Search
None
See application file for complete search history.

(56) References Cited

U.S. PATENT DOCUMENTS 3,789,415 A   1/1974   Vickland
3,844,341 A  10/1974   Bimshas, Jr. et al.
(Continued)

FOREIGN PATENT DOCUMENTS

CN    1284794 A    2/2001
CN  104635203 A    5/2015
(Continued)

OTHER PUBLICATIONS

U.S. Notice of Allowance from U.S. Appl. No. 15/186,134 dated Mar. 14, 2017, 8 pages.
(Continued)

*Primary Examiner* — Whitney Moore
(74) *Attorney, Agent, or Firm* — Haynes Beffel & Wolfeld LLP; Mark A. Haynes; Andrew L. Dunlap

(57) ABSTRACT

There is provided an apparatus comprising a location receiver to receive a signal indicative of a location of the location receiver. A movement mechanism rotates the location receiver about an axis and provides an angle of the location receiver about the axis from a known point. Calculation circuitry produces an output value indicative of an absolute bearing of the known point about the axis, based on a plurality of given angles of the location receiver about the axis from the known point, and a plurality of associated locations of the location receiver indicated by the signal received when the location receiver is at each of the given angles.

22 Claims, 13 Drawing Sheets

(51) Int. Cl.

| | | |
|---|---|---|
| H05K 7/20 | (2006.01) | |
| H01Q 21/06 | (2006.01) | |
| H01Q 21/28 | (2006.01) | |
| H04W 84/04 | (2009.01) | |
| H04W 84/02 | (2009.01) | |
| H04W 88/08 | (2009.01) | |
| H04W 24/02 | (2009.01) | |
| H04W 4/50 | (2018.01) | |
| G01S 3/14 | (2006.01) | |
| G01S 5/02 | (2010.01) | |
| G01S 19/53 | (2010.01) | |
| H01Q 3/04 | (2006.01) | |
| H04B 7/06 | (2006.01) | |
| H04B 7/08 | (2006.01) | |
| F16M 11/06 | (2006.01) | |
| G01S 3/04 | (2006.01) | |
| G01S 19/24 | (2010.01) | |
| H01Q 1/02 | (2006.01) | |
| H01Q 1/12 | (2006.01) | |
| H01Q 1/24 | (2006.01) | |
| H01Q 1/36 | (2006.01) | |
| H01Q 1/42 | (2006.01) | |
| H01Q 1/50 | (2006.01) | |
| H01Q 3/02 | (2006.01) | |
| H01Q 3/10 | (2006.01) | |
| H01Q 3/12 | (2006.01) | |
| H01Q 3/24 | (2006.01) | |
| H01Q 3/26 | (2006.01) | |
| H01Q 3/36 | (2006.01) | |
| H01Q 21/00 | (2006.01) | |
| H01Q 21/08 | (2006.01) | |
| H01Q 21/20 | (2006.01) | |
| H01Q 21/24 | (2006.01) | |
| H01Q 25/00 | (2006.01) | |
| H04B 7/0456 | (2017.01) | |
| H04L 12/24 | (2006.01) | |
| H04L 12/26 | (2006.01) | |
| H04L 29/08 | (2006.01) | |
| H04W 16/28 | (2009.01) | |
| H04W 24/08 | (2009.01) | |
| H04W 24/10 | (2009.01) | |
| H04W 28/02 | (2009.01) | |
| H04W 28/24 | (2009.01) | |
| H04W 40/22 | (2009.01) | |
| H04W 48/06 | (2009.01) | |
| H04W 72/04 | (2009.01) | |

(52) U.S. Cl.
CPC .......... *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/08* (2013.01); *H01Q 21/205* (2013.01); *H01Q 21/24* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/50* (2018.02); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H01Q 21/065* (2013.01); *H01Q 21/28* (2013.01); *H04B 7/0817* (2013.01); *H04W 84/02* (2013.01); *H04W 84/045* (2013.01); *H04W 88/08* (2013.01)

(56) References Cited

U.S. PATENT DOCUMENTS

| | | | |
|---|---|---|---|
| 4,436,190 A | 3/1984 | Wentzell | |
| 4,599,620 A | 7/1986 | Evans | |
| 4,633,256 A | 12/1986 | Chadwick | |
| 4,959,653 A | 9/1990 | Ganz | |
| 5,049,891 A | 9/1991 | Ettinger et al. | |
| 5,125,008 A | 6/1992 | Trawick et al. | |
| 5,357,259 A | 10/1994 | Nosal | |
| 6,124,832 A | 9/2000 | Jeon et al. | |
| 6,404,385 B1 | 6/2002 | Croq et al. | |
| 6,448,930 B1 | 9/2002 | Judd | |
| 6,486,832 B1 | 11/2002 | Abramov et al. | |
| 6,522,898 B1 | 2/2003 | Kohno et al. | |
| 6,621,454 B1 | 9/2003 | Reudink et al. | |
| 6,784,830 B1* | 8/2004 | Lawrence | G01S 19/30 342/357.72 |
| 6,934,511 B1 | 8/2005 | Lovinggood et al. | |
| 6,963,747 B1 | 11/2005 | Elliott | |
| 7,062,294 B1 | 6/2006 | Rogard et al. | |
| 7,403,748 B1 | 7/2008 | Keskitalo et al. | |
| 7,515,916 B1 | 4/2009 | Alexander | |
| 7,593,693 B1 | 9/2009 | Kasapi et al. | |
| 7,664,534 B1 | 2/2010 | Johnson | |
| 7,697,626 B2 | 4/2010 | Wang et al. | |
| 8,340,580 B1 | 12/2012 | Epstein | |
| 8,509,724 B2 | 8/2013 | D'Amico et al. | |
| 8,577,416 B2 | 11/2013 | Nandagopalan et al. | |
| 8,630,267 B1 | 1/2014 | Jin | |
| 9,173,064 B1 | 10/2015 | Spain, Jr. | |
| 9,179,360 B1 | 11/2015 | Vivanco | |
| 9,692,124 B2 | 6/2017 | Caimi et al. | |
| 9,698,891 B2 | 7/2017 | Larsson | |
| 9,706,419 B2 | 7/2017 | Bozier et al. | |
| 9,924,385 B2 | 3/2018 | Lysejko et al. | |
| 9,973,943 B2 | 5/2018 | Lysejko et al. | |
| 2002/0042274 A1 | 4/2002 | Ades | |
| 2002/0142779 A1 | 10/2002 | Goto et al. | |
| 2002/0159409 A1 | 10/2002 | Wolfe et al. | |
| 2003/0195017 A1 | 10/2003 | Chen et al. | |
| 2003/0228857 A1 | 12/2003 | Maeki | |
| 2004/0043745 A1* | 3/2004 | Najarian | G01S 19/21 455/334 |
| 2004/0077354 A1 | 4/2004 | Jason et al. | |
| 2004/0106436 A1 | 6/2004 | Ochi et al. | |
| 2004/0204850 A1* | 10/2004 | MacNeille | G01S 3/14 701/469 |
| 2004/0233103 A1 | 11/2004 | Toshev | |
| 2004/0242274 A1 | 12/2004 | Corbett et al. | |
| 2005/0048921 A1 | 3/2005 | Chung | |
| 2005/0063340 A1 | 3/2005 | Hoffmann et al. | |
| 2005/0157684 A1 | 7/2005 | Ylitalo et al. | |
| 2005/0192037 A1 | 9/2005 | Nanda et al. | |
| 2005/0285784 A1 | 12/2005 | Chiang et al. | |
| 2006/0072518 A1 | 4/2006 | Pan et al. | |
| 2006/0292991 A1 | 12/2006 | Abramov et al. | |
| 2008/0005121 A1 | 1/2008 | Lam et al. | |
| 2008/0123589 A1 | 5/2008 | Lee et al. | |
| 2008/0287068 A1 | 11/2008 | Etemad | |
| 2009/0005121 A1 | 1/2009 | Wong et al. | |

(56) References Cited

U.S. PATENT DOCUMENTS

| | | |
|---|---|---|
| 2009/0032223 A1 | 2/2009 | Zimmerman et al. |
| 2009/0046638 A1 | 2/2009 | Rappaport et al. |
| 2009/0067333 A1 | 3/2009 | Ergen et al. |
| 2009/0086864 A1 | 4/2009 | Komninakis et al. |
| 2009/0103492 A1 | 4/2009 | Altshuller et al. |
| 2009/0116444 A1 | 5/2009 | Wang et al. |
| 2009/0207077 A1 | 8/2009 | Hwang et al. |
| 2009/0252088 A1 | 10/2009 | Rao et al. |
| 2009/0274076 A1 | 11/2009 | Muharemovic et al. |
| 2009/0310554 A1 | 12/2009 | Sun et al. |
| 2010/0071049 A1 | 3/2010 | Bahr et al. |
| 2010/0130150 A1 | 5/2010 | D'Amico et al. |
| 2010/0216477 A1 | 8/2010 | Ryan |
| 2010/0240380 A1 | 9/2010 | Yim et al. |
| 2011/0003554 A1 | 1/2011 | Sekiya |
| 2011/0163905 A1 | 7/2011 | Denis et al. |
| 2011/0235569 A1 | 9/2011 | Huang et al. |
| 2011/0244808 A1 | 10/2011 | Shiotsuki et al. |
| 2011/0312269 A1 | 12/2011 | Judd et al. |
| 2012/0002598 A1 | 1/2012 | Seo et al. |
| 2012/0015659 A1 | 1/2012 | Kalyani et al. |
| 2012/0046026 A1 | 2/2012 | Chande et al. |
| 2012/0119951 A1 | 5/2012 | Vollath |
| 2012/0252453 A1 | 10/2012 | Nagaraja et al. |
| 2012/0299765 A1 | 11/2012 | Huang et al. |
| 2012/0329511 A1 | 12/2012 | Keisu |
| 2013/0041549 A1* | 2/2013 | Reeve .................. B62D 15/025 701/28 |
| 2013/0203401 A1 | 8/2013 | Ryan et al. |
| 2013/0215844 A1 | 8/2013 | Seol et al. |
| 2014/0256376 A1 | 9/2014 | Weissman et al. |
| 2014/0313080 A1 | 10/2014 | Smith et al. |
| 2015/0065164 A1* | 3/2015 | Hoseinitabatabaei . G01C 21/16 455/456.1 |
| 2015/0078191 A1 | 3/2015 | Jongren et al. |
| 2016/0037550 A1 | 2/2016 | Barabell et al. |
| 2016/0255667 A1 | 9/2016 | Schwartz |
| 2016/0262045 A1 | 9/2016 | Yang et al. |
| 2016/0277087 A1 | 9/2016 | Jo et al. |
| 2016/0377695 A1 | 12/2016 | Lysejko et al. |
| 2016/0380353 A1 | 12/2016 | Lysejko et al. |
| 2016/0380354 A1 | 12/2016 | Bozier et al. |
| 2016/0380355 A1 | 12/2016 | Lysejko et al. |
| 2016/0380363 A1 | 12/2016 | Logothetis |
| 2016/0381570 A1 | 12/2016 | Lysejko et al. |
| 2016/0381574 A1 | 12/2016 | Dudzinski et al. |
| 2016/0381585 A1 | 12/2016 | Dudzinski et al. |
| 2016/0381590 A1 | 12/2016 | Lysejko et al. |
| 2016/0381591 A1 | 12/2016 | Lysejko et al. |
| 2016/0381698 A1 | 12/2016 | Grinshpun et al. |
| 2017/0111181 A1 | 4/2017 | Zhou |
| 2017/0280314 A1 | 9/2017 | Yang et al. |

FOREIGN PATENT DOCUMENTS

| | | |
|---|---|---|
| EP | 0654915 A2 | 5/1995 |
| EP | 1903348 A1 | 3/2008 |
| EP | 2113145 A1 | 11/2009 |
| EP | 2207267 A2 | 7/2010 |
| EP | 2391157 A2 | 11/2011 |
| EP | 2448144 A1 | 5/2012 |
| EP | 2506625 A1 | 10/2012 |
| EP | 2538712 A1 | 12/2012 |
| GB | 2318914 A | 5/1998 |
| GB | 2484377 A | 4/2012 |
| JP | H05188128 A | 7/1993 |
| JP | H06188802 A | 7/1994 |
| KR | 101346062 B1 | 12/2013 |
| WO | 9426001 A1 | 11/1994 |
| WO | 199965105 A1 | 12/1999 |
| WO | 0152447 A2 | 7/2001 |
| WO | 0231908 A2 | 4/2002 |
| WO | 03096560 A1 | 11/2003 |
| WO | 2004095764 A2 | 11/2004 |
| WO | 2004114546 A1 | 12/2004 |
| WO | 2005064967 A1 | 7/2005 |
| WO | 2007010274 A1 | 1/2007 |
| WO | 2007069809 A1 | 6/2007 |
| WO | 2008/064696 A1 | 6/2008 |
| WO | 2008111882 A1 | 9/2008 |
| WO | 2008151057 A2 | 12/2008 |
| WO | 2010077790 A1 | 7/2010 |
| WO | 2011044947 A1 | 4/2011 |
| WO | 2011060058 A1 | 5/2011 |
| WO | 2014106539 A1 | 7/2014 |

OTHER PUBLICATIONS

U.S. Office Action in U.S. Appl. No. 15/182,209 dated Apr. 13, 2017, 17 pages.

Doi et al., "Low-Cost Antenna Array Via Antenna Switching for High Resolution 2-D DOA Estimation," SIPS 2013 Proc. IEEE, Oct. 16, 2013, pp. 83-88.

Jung et al., "Attitude Sensing Using a GPS Antenna on a Turntable: Experimental Tests," NAVIGATION, J. of the Institute of Navigation, Fairfax, VA, US, vol. 51, No. 3, Dec. 1, 2004, pp. 221-230.

PCT Search Report from PCT/GB2016/051234 (corresponding to U.S. Appl. No. 15/187,570), dated Aug. 5, 2016, 13 pgs.

PCT Search Report from PCT/GB2016/051360 (corresponding to U.S. Appl. No. 15/187,900), dated Aug. 19, 2016, 12 pgs.

PCT Search Report from PCT/GB2016/051615 (corresponding to U.S. Appl. No. 15/187,515), dated Aug. 12, 2016, 13 pgs.

PCT Search Report from PCT/GB2016/051617 (corresponding to U.S. Appl. No. 15/187,616), dated Aug. 23, 2016, 11 pgs.

PCT Search Report from PCT/GB2016/051618 (corresponding to U.S. Appl. No. 15/187,602), dated Aug. 12, 2016, 12 pgs.

PCT Search Report from PCT/GB2016/051759 (corresponding to U.S. Appl. No. 15/187,680), dated Sep. 14, 2016, 15 pgs.

PCT Written Opinion from PCT/GB2016/051195, dated May 17, 2017, 5 pgs.

PCT Written Opinion from PCT/GB2016/051205, dated May 16, 2017, 5 pgs.

PCT Written Opinion from PCT/GB2016/051234, dated May 17, 2017, 10 pgs.

PCT Written Opinion from PCT/GB2016/051285, dated May 10, 2017, 5 pgs.

PCT Written Opinion from PCT/GB2016/051360, dated Jun. 1, 2017, 6 pgs.

PCT Written Opinion from PCT/GB2016/051428, dated Jun. 2, 2017, 12 pgs.

PCT Written Opinion from PCT/GB2016/051615, dated May 17, 2017, 5 pgs.

PCT Written Opinion from PCT/GB2016/051759, dated May 18, 2017, 6 pgs.

Office Action in related Case U.S. Appl. No. 15/186,134 dated Nov. 22, 2016, 18 pages.

PCT Search Report from PCT/GB2016/051428 (corresponding to U.S. Appl. No. 15/187,188), dated Dec. 13, 2016, 19 pgs.

Office Action in related Case U.S. Appl. No. 15/187,574 dated May 15, 2018, 13 pages.

U.S. Appl. No. 15/187,570—Office Action dated Feb. 27, 2018, 16 pages.

U.S. Appl. No. 15/187,602—Office Action dated Feb. 22, 2018, 19 pages.

U.S. Notice of Allowance from U.S. Appl. No. 15/187,515 dated May 4, 2018, 8 pages.

U.S. Notice of Allowance from U.S. Appl. No. 15/187,616 dated Jan. 9, 2018, 12 pages.

U.S. Notice of Allowance from U.S. Appl. No. 15/187,680 dated May 21, 2018, 8 pages.

U.S. Office Action in U.S. Appl. No. 15/187,574 dated Dec. 15, 2017, 14 pages.

UK Search Report from GB 1514938.8, dated Apr. 18, 2016, 4 pgs.
UK Search Report from GB 1516901.4, dated Mar. 18, 2016, 5 pgs.
UK Search Report from GB 1518654.7, dated Mar. 24, 2016, 3 pgs.
UK Search Report from GB 1519216.4, dated Apr. 15, 2016, 5 pgs.
UK Search Report from GB 1519220.6, dated Apr. 4, 2016, 4 pgs.

(56) References Cited

OTHER PUBLICATIONS

UK Search Report from GB 1519228.9, dated Apr. 29, 2016, 4 pgs.
UK Search Report from GB 1519270.1, dated Apr. 25, 2016, 5 pgs.
UK Search Report from GB 1519272.7, dated Jun. 10, 2016, 3 pgs.
UK Search Report from GB 1519273.5, dated Apr. 27, 2016, 3 pgs.
PCT Search Report from PCT/GB2016/051195, dated Jul. 25, 2016, 13 pgs.
PCT Search Report from PCT/GB2016/051205, dated Jul. 25, 2016, 13 pgs.
Office Action in related Case U.S. Appl. No. 15/187,680 dated Nov. 3, 2017, 8 pages.
PCT Search Report from PCT/GB2016/051285, dated Jul. 13, 2016, 12 pgs.
UK Search Report from GB 1519237.0, dated Jun. 10 Apr. 2016, 3 pgs.
Office Action in related Case U.S. Appl. No. 15/187,515 dated Dec. 7, 2017, 9 pages.
U.S. Notice of Allowance from U.S. Appl. No. 15/182,209 dated Nov. 22, 2017, 13 pages.
U.S. Notice of Allowance from U.S. Appl. No. 15/187,574 dated Dec. 15, 2017, 14 pages.
U.S. Office Action from U.S. Appl. No. 15/187,570 dated Jun. 7, 2019, 17 pages.

\* cited by examiner

BEARING CALCULATION

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1514938.8, filed 21 Aug. 2015 and entitled "BEARING CALCULATION". Both applications are incorporated by reference herein.

BACKGROUND

The present technique relates to the field of data processing and more particularly the calculation of bearings.

It is known to use global navigation system signals in order to determine the location of a device capable of receiving such signals. For example, such navigation systems signals include GPS (The Global Positioning System), GLONASS (The Russian Global Navigation Satellite System), the planned European Union Galileo positioning system, India's Indian Regional Navigation Satellite System and the Chinese BeiDou Navigation Satellite System as well as ground-based navigation system signals such as is used in A-GPS (assisted-GPS). These systems typically provide an absolute location of the receiving device. For example, a GPS receiver can translate received GPS signals into longitudes and latitudes.

Such navigation systems, although highly precise, are often slightly inaccurate. For example, a GPS signal may provide a location that is several metres away from the correct location.

Additionally, although such systems typically provide a location of the receiver, it would be desirable to be able to use these systems to produce an absolute bearing, e.g. a bearing relative to true north or true east (90 degrees clockwise of true north). Knowledge of an absolute bearing can be particularly useful in communications systems. For example, knowing the absolute bearing of a directional antenna may have make it possible to estimate which devices are likely to receive a transmission.

Viewed from a first example configuration, there is provided an apparatus comprising: a location receiver to receive a signal indicative of a location of the location receiver; a movement mechanism to rotate the location receiver about an axis and to provide an angle of the location receiver about the axis from a known point; and calculation circuitry to produce an output value indicative of an absolute bearing of the known point about the axis, based on a plurality of given angles of the location receiver about the axis from the known point, and a plurality of associated locations of the location receiver indicated by the signal received when the location receiver is at each of the given angles.

Viewed from a second example configuration, there is provided a method comprising the steps: receiving a signal indicative of a location of the location receiver; rotating the location receiver about an axis; providing an angle of the location receiver about the axis from a known point; and producing an output value indicative of an absolute bearing of the known point about the axis, based on a plurality of given angles of the location receiver about the axis from the known point, and a plurality of associated locations of the location receiver indicated by the signal received when the location receiver is at each of the given angles.

Viewed from a third example configuration, there is provided An apparatus comprising: means for receiving a signal indicative of a location of the location receiver; means for rotating the location receiver about an axis; means for providing an angle of the location receiver about the axis from a known point; and means for producing an output value indicative of an absolute bearing of the known point about the axis, based on a plurality of given angles of the location receiver about the axis from the known point, and a plurality of associated locations of the location receiver indicated by the signal received when the location receiver is at each of the given angles.

BRIEF DESCRIPTION OF THE DRAWINGS

The present technique will be described further, by way of example only, with reference to embodiments thereof as illustrated in the accompanying drawings, in which.

Figure 1:
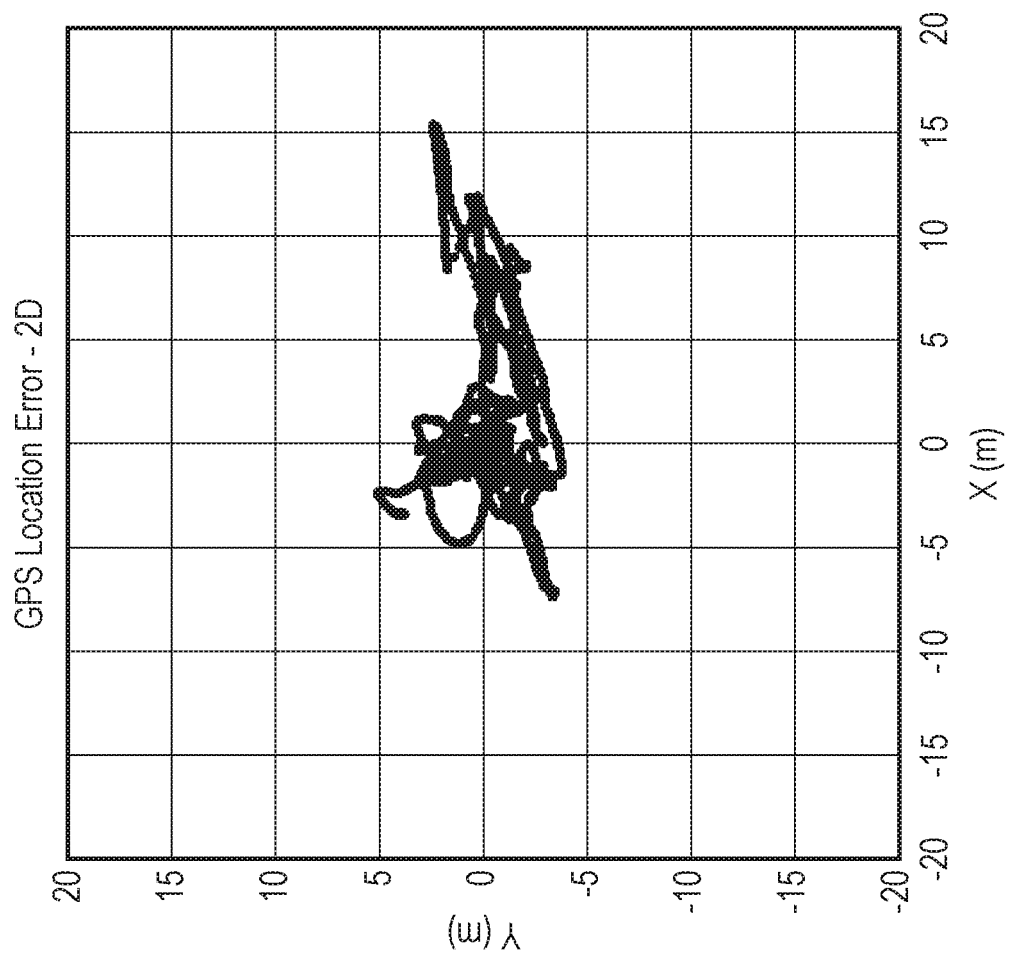
FIG. 1 illustrates an example GPS error from a stationary receiver.

Before discussing the embodiments with reference to the accompanying figures, the following description of embodiments and associated advantages is provided.

In accordance with one example configuration there is provided an apparatus comprising: a location receiver to receive a signal indicative of a location of the location receiver; a movement mechanism to rotate the location receiver about an axis and to provide an angle of the location receiver about the axis from a known point; and calculation circuitry to produce an output value indicative of an absolute bearing of the known point about the axis, based on a plurality of given angles of the location receiver about the axis from the known point, and a plurality of associated locations of the location receiver indicated by the signal received when the location receiver is at each of the given angles.

In accordance with the above, a location receiver is rotated (e.g. in a circle) about an axis. At two or more angles (measured in radians) of the location receiver about the axis from the known point (e.g. at two or more angular displacements from the known point), a reading is taken from the location receiver in order to arrive at an angle/reading pair. The calculation circuitry uses two or more of these pairs in order to determine an absolute bearing of the known point.

By determining the absolute bearing in this manner, it is possible to compensate for inaccuracy in the location signal while determining the absolute bearing of the known point, which can be used to establish how the apparatus is oriented.

In some embodiments, the apparatus further comprises: a noise filter, wherein the signal indicative of the location of the location receiver comprises a noise component; and the noise filter is to filter out the noise component. The filter may be used to remove a noise component from the received signal that is used to determine a location of the receiver. For example, the filter may be a low-pass filter. The filter can be used to further increase the accuracy of the absolute bearing determined by the calculation circuitry. The noise filter may be implemented at a variety of different points within the apparatus.

Although the calculation circuitry may have a number of different components, in some embodiments, the calculation circuitry comprises: a correlator to correlate the angle of the location receiver about the axis from a known point and output a correlation result; and a phase angle extractor to produce the output value from the correlation result.

In some embodiments, the correlator comprises: a multiplier to multiply the location of the location receiver by $e^{-j\varphi}$, where j is the unit imaginary number and $\varphi$ is the angle of the location receiver about the axis from the known point with which the location is associated, and to output a plurality of multiplication results; and an integrate and dump filter to operate on the plurality of multiplication results. The correlator in these embodiments considers an angle/reading pair (the reading taken at a particular angle from the known point about the axis). The particular angle is denoted by $\varphi$. A particular reading is multiplied by the conjugate, i.e. $e^{-j\varphi}$, where j is the unit imaginary number (often referred to as i, or $\sqrt{(-1)}$). This produces a single multiplication result. By providing multiple angle/reading pairs, a plurality of multiplication results are produced. These are provided to an integrate and dump filter. The integrate and dump filter may, for example, average the provided values and accordingly, eliminate or reduce any noise component inherent in the location value obtained from the location receiver. The result from the integrate and dump filter is the output value and this is indicative of an absolute bearing of the known point about the axis.

The absolute bearing may be represented in a number of different ways. For example, in some embodiments, the absolute bearing of the known point about the axis is a bearing of the known point about the axis relative to true east. The term "true east" is used here to refer to 90 degrees clockwise from true north. For example, true east can be thought of as being along the line of zero latitude. In other embodiments, the absolute bearing may be a bearing relative to true north.

The received signal may be indicative of a location of the location receiver in a number of different ways. For example, in some embodiments, the signal is indicative of a longitude and latitude of the location receiver.

In some embodiments, the signal is a navigation system signal. For example, the signal may be a satellite based global navigation system signal that allows a receiver to estimate or determine its location based on the time taken for signals to travel from one or more satellites to the receiver. These timings may then be used to narrow down the possible locations of the receiver, for example, into an average or expected longitude and latitude. An example of such a satellite based global navigation system signal is a GPS signal. Other systems may include GLONASS (The Russian Global Navigation Satellite System), the planned European Union Galileo positioning system, India's Indian Regional Navigation Satellite System and the Chinese BeiDou Navigation Satellite System.

In some embodiments, the apparatus receives a further signal indicative of a location of the location receiver; and the further signal is a ground based global navigation system signal. Such systems may be used in order to further refine or aid the determination of the location of the location receiver. For example, assisted-GPS (A-GPS) is a ground-based system that can be used to improve the startup performance of a GPS receiver in order for a location receiver to determine its location more quickly.

In some embodiments, the apparatus further comprises: an antenna assembly to perform at least one of receiving or transmitting a further signal, wherein the antenna assembly defines a reference plane; the movement mechanism is to rotate the antenna assembly about the axis; the location receiver is directly or indirectly mounted to the antenna assembly at a distance from the axis equal to the radius such that when the movement mechanism rotates the antenna assembly about the axis, the location receiver rotates about the axis. In such embodiments, the location receiver is directly or indirectly mounted on the antenna assembly such that as the antenna assembly rotates, the location receiver rotates as well. Accordingly, once the absolute bearing of the known point has been determined, since the rotation of the location receiver/antenna assembly around the known point at the axis is known, it is possible to determine the absolute bearing of a reference plane of the antenna assembly. This can be useful where the antenna assembly prominently transmits or receives in a particular direction, in order to help orient the antenna assembly in order to improve reception and/or transmission.

In some embodiments, the apparatus further comprises: an antenna bearing calculation unit to determine an indication of an absolute bearing of the reference plane based on an absolute bearing of the known point about the axis, an angle of the location receiver about the axis from a known point and a position at which the location receiver is directly or indirectly mounted to the antenna assembly. The antenna bearing calculation unit may be used to determine the absolute bearing of the reference plane at a particular time.

There are a number of ways of representing an indication of the absolute bearing of the reference plane. However, in some embodiments, the indication of the absolute bearing of the reference plane is a vector perpendicular to the reference plane.

In some embodiments, the axis is perpendicular to the reference plane; and the axis passes through a mid-point of the antenna assembly. In this manner, the antenna assembly may rotate on the spot. For example, the orientation of the rotation assembly changes without changing the position of the assembly. Conversely, the location receiver continues to rotate at a radius, thereby altering its position as it rotates.

In some embodiments, the axis is upright. For example, the axis may be substantially perpendicular to the plane of the ground.

In some embodiments, the calculation circuitry is to produce the output value and a further output value indicative of a tilt of the location receiver, additionally based on a radius between the location receiver and the axis. The tilt of the location receiver may be defined as, for example, the angle between the horizontal plane (e.g. the plane tangent to the Earth's surface at the location of the apparatus) and the plane formed by the rotation of the location receiver about the axis. Calculating both the tilt and the absolute bearing can be achieved by additionally considering the radius between the location receiver and the axis (in addition to the plurality of given angles of the location receiver about the axis from the known point and the plurality of associated locations of the location receiver indicated by the signal received when the location receiver is at each of the given angles).

There are a number of ways in which the tilt can be determined. In some embodiments, the calculation circuitry comprises cost minimising circuitry to calculate the output value and further output value by performing a cost minimising function. For example, the cost minimising function can be based on a least squares estimate of the output value and the further output value. For example, given a cost function C(absolute bearing, tilt), the cost minimising function may use a least squares estimate in order to seek the absolute bearing and tilt values that best fit the received location data from the location receiver.

In some other embodiments, the calculation circuitry comprises: a correlator to correlate the angle of the location receiver about the axis from a known point and output a correlation result; a phase angle extractor to produce the output value from the correlation result; and a tilt estimator to produce the further output value based on a magnitude of the correlation result.

Particular embodiments will now be described with reference to the figures.

FIG. 1 illustrates the error when a received GPS signal is translated into a longitude and latitude. A GPS receiver was placed in a stationary location. The graph shown in FIG. 1 is a trace that indicates, over time, how the error in calculated position changes. The trace shows that, in this case, the error in the y axis deviated from about 5 metres to −5 metres and the error in the x axis deviated from about −7 metres to just over 15 metres. Hence, it can be seen that the position determined from a GPS signal may be inaccurate. Although this figure relates to the error encountered when using a received GPS signal, it will be appreciated that similar errors may be encountered with other navigation system signals such as satellite based global navigation system signals. Ordinarily, GPS coordinates are given as a longitude ($\tilde{\alpha}_k$) and latitude ($\tilde{\beta}_k$) for a reading number k. Small angle approximation can be used to convert longitude and latitude into a Cartesian coordinate system measured in metres where the centre of the Cartesian coordinate system is the average of the longitude and latitude measurements. Specifically, assuming the Earth has a constant radius of 6371000 metres, the $x_k$ and $y_k$ coordinates of a reading number k (out of K total readings) are:

$$x_k = \left(\tilde{\beta}_k - K^{-1}\sum_{k'=1}^{K}\tilde{\beta}_{k'}\right)\frac{\pi 6371000}{180}\cos\left(\frac{\pi}{180K}\sum_{k'=1}^{K}\tilde{\alpha}_{k'}\right)$$

$$y_k = \left(\tilde{\alpha}_{k'} - K^{-1}\sum_{k'=1}^{K}\tilde{\alpha}_{k'}\right)\frac{\pi 6371000}{180}$$

Figure 2:
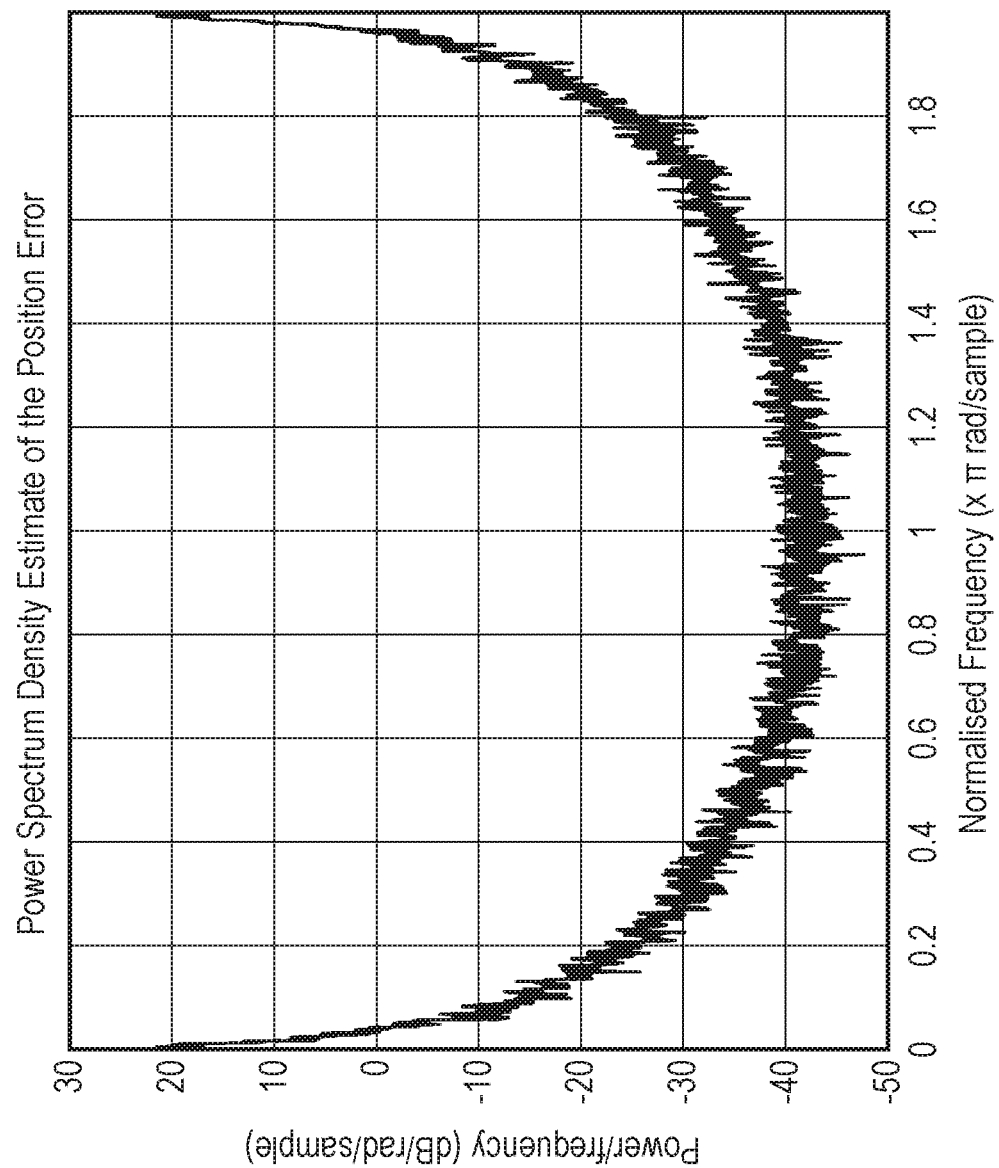
FIG. 2 illustrates a power spectrum density estimate of the position error shown in FIG. 1.

FIG. 2 illustrates a power spectrum density graph of the position error shown in FIG. 1. The profile of the graph shown in FIG. 2 is not flat, thereby indicating that the position error cannot be modelled as Additive White Gaussian Noise. A different process must therefore be used in order to overcome the noise component associated with the location estimation error.

Figure 3:
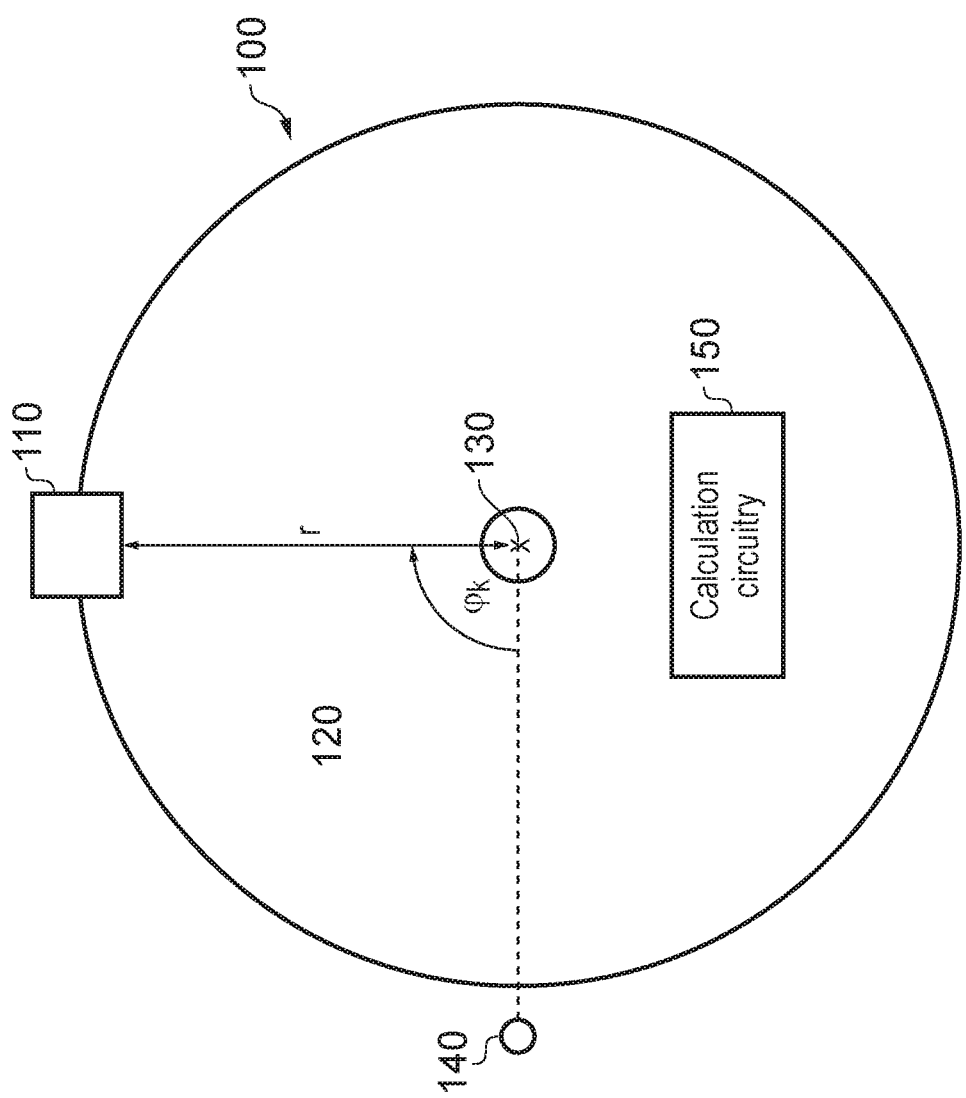
FIG. 3 schematically illustrates an apparatus in accordance with one embodiment.

FIG. 3 schematically illustrates an apparatus 100 in accordance with one embodiment. The apparatus comprises a location receiver 110. The location receiver is able to receive a signal that indicates the location of the location receiver 110. In the embodiment shown in FIG. 3, the signal is a GPS signal. However, the signal may be a navigation system signal such as a satellite based global navigation system signal. In some embodiments, the location receiver 110 is able to receive a further signal indicative of the location of the location receiver, from a ground based global navigation system. This can be used to further refine the determined location of the location receiver or may be used to assist in the determination of the location of the location receiver using the signal.

The location receiver 110 may be made to rotate about an axis 130 using a movement mechanism. The location receiver rotates at a radius r from the axis 130. In this embodiment, the location receiver 110 is directly attached to the movement mechanism 120 itself, which rotates about the axis 130. The location receiver 110 is therefore capable of clockwise or anticlockwise movement about axis 130. The location receiver 110 makes an angle with a known point 140 and the movement mechanism 120 is able to determine this angle. In FIG. 3, for example, the location receiver 110 makes a π/2 angle with the known point 140 at the axis 130. As the location receiver 110 rotates, it receives a plurality of signals in order to provide a plurality of locations. The calculation circuitry 150 is able to determine the absolute bearing of the known point 140 based on the plurality of locations and the plurality of angles made between the location receiver 110, the axis 130, and the known point 140 when each location was determined. For example, if the location receiver determines a first location L1 at π/2 radians and a second location L2 at π radians then these pairings are used by the calculation circuitry 150 in order to determine the absolute bearing of the known point 140. The absolute bearing, in this embodiment, is relative to true east (i.e. 90 degrees clockwise of true north at a latitude of 0). In other embodiments, other points of reference may be used in order to determine the absolute bearing.

Although the above apparatus describes the use of a GPS signal, the location receiver 110 may also use other satellite based systems. For example, the location receiver 110 may operating using a GLONASS (The Russian Global Navigation Satellite System) signal. The apparatus may alternatively use a ground-based navigation signal, or may use such a signal in addition to a satellite based system in order to assist the operation of or refine the estimate produced by, a satellite based system.

Figure 4:
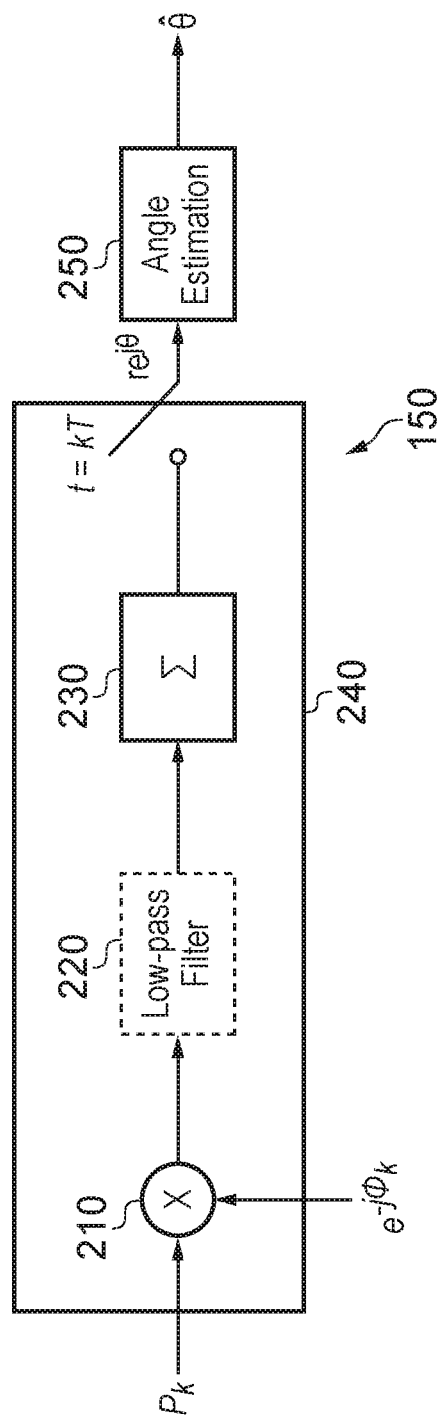
FIG. 4 shows calculation circuitry in accordance with one embodiment.

FIG. 4 schematically illustrates an example of the calculation circuitry 150 in accordance with one embodiment. The calculation circuitry comprises a correlator 240 and a phase angle extractor 250. The correlator 240 comprises a multiplier 210. The multiplier 210 receives location reading number k, $P_k$ based on the signal received from the location receiver 110. $P_k$ is a complex number, having a real component and an imaginary component with the real component corresponding with an estimate of the location along the x axis and the imaginary component corresponding with an estimate of the location along the y axis. $P_k$ may be thought of as having the following relationship:

$$P_k = re^{j(\theta + \varphi_k)} + n_k$$

Where r is the radius that the location receiver 110 makes with the axis 130, j is the unit imaginary number (i.e. √(−1)), θ is the absolute bearing of the known point 140 about the axis 130, $\varphi_k$ is the bearing of the location receiver 110 from the known point 140 about the axis 130 at reading k, and $n_k$ is the noise component at reading k. This equation represents a conversion of a location reading into polar form. It also recognises that the location of the location receiver about the axis 130 is a function of absolute bearing of the known point 140 and the angle that the location receiver makes with the axis 130 and the known point 140.

The multiplier 210 multiplies $P_k$ by the conjugate $e^{-j(\varphi_k)}$. This has the effect of cancelling out $e^{j(\varphi_k)}$:

$$P_k \times e^{-j(\varphi_k)} = re^{j(\theta)} + n_k e^{-j(\varphi_k)}$$

Accordingly, the result of the multiplication is a function of θ, i.e. the absolute bearing of the known point 140 about the axis 130 and a modified noise component $n_k e^{-j(\varphi_k)}$.

In this embodiment, the multiplication result passes through a low pass filter 220. This filter is strictly optional and in other embodiments, the multiplication result may pass directly to the integrate and dump filter 230. In this embodiment, the low-pass filter performs a filtering process such that the noise component is reduced.

In any event, the multiplication result or filtered multiplication result passes to the integrate and dump filter 230. This determines a total sum (T) of all readings in order to provide an average value. The averaging performed by the integrate and dump filter 230 has the effect of reducing or eliminating the noise component, thereby producing the value $re^{j(\theta)}$. From this, an angle estimation $\hat{\theta}$ is produced using a phase angle extractor 250.

In this embodiment, the angle estimate corresponds with the absolute bearing of the known point 140 relative to true east. In other words, an angle estimate of 0 means that the bearing of the known point about the axis 130 points true east (where true east is π/2 radians clockwise of true north, along a line of 0 latitude).

Figure 5:
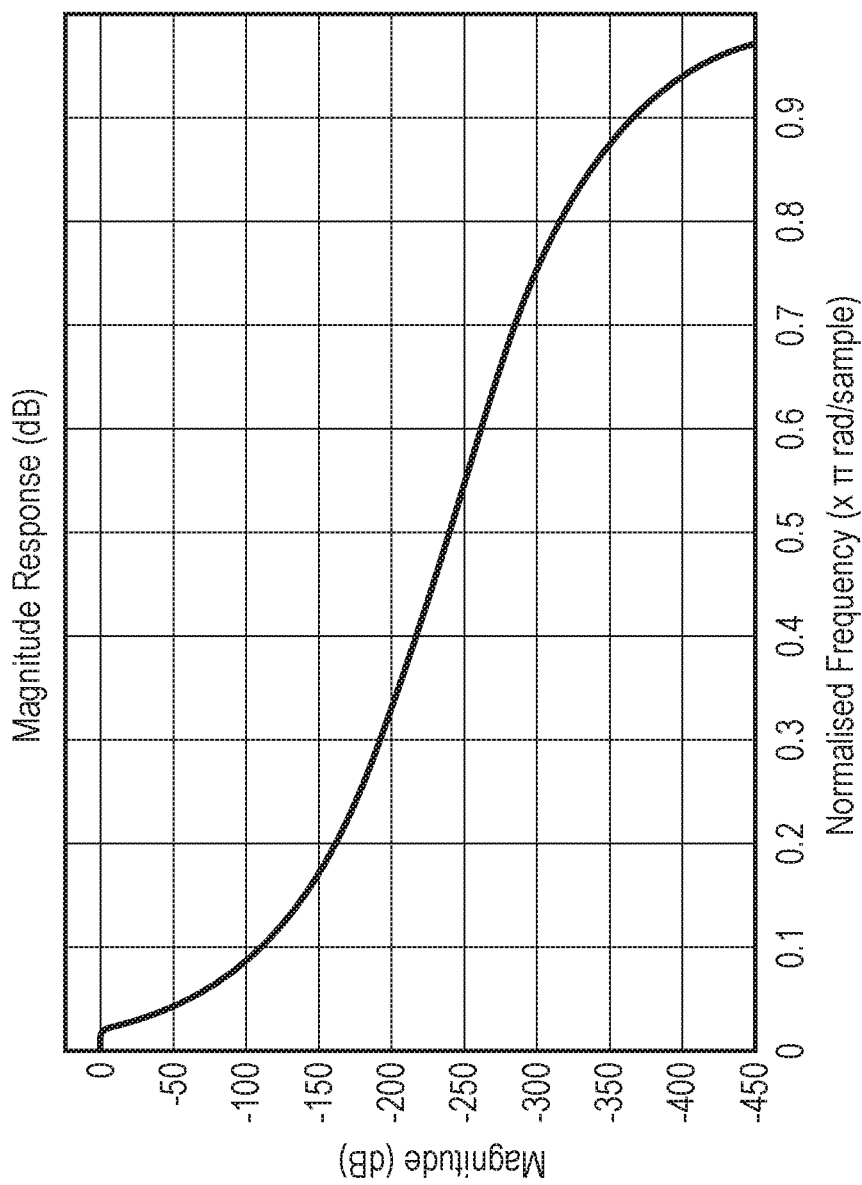
FIG. 5 illustrates characteristics of a suitable low-pass filter for use in one embodiment.

FIG. 5 illustrates an example configuration of suitable characteristics for the optional low-pass filter 220. It is clear from FIG. 5 that frequencies in the signal with a low frequency are allowed to pass whereas higher frequency components of the signal are dampened.

Figure 6:
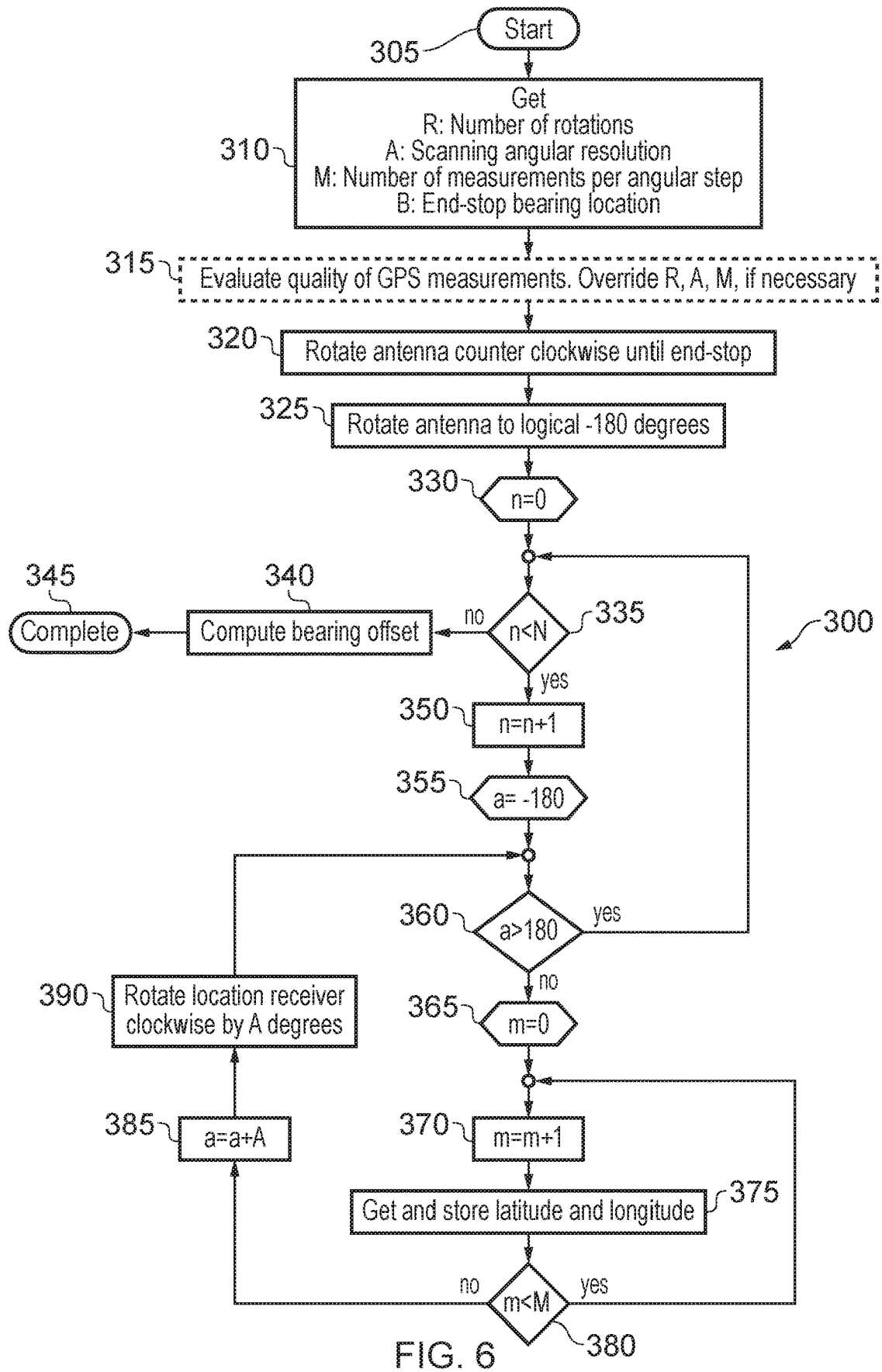
FIG. 6 shows a flow chart illustrating an embodiment of determining a bearing in accordance with one embodiment.

FIG. 6 shows a flow chart, which illustrates the procedure for collecting a plurality of location values as the location receiver 110 rotates about the axis 130. A total of N×(2π/A)×M readings are taken, in which N is the number of rotations performed by the location receiver 110 about the axis 130, A is the scanning angular resolution (e.g. the number of radians between each angular step), and M is the number of measurements per angular step.

The process starts at step 305 and at step 310, the variables N, A, and M are set to the desired values as specified above. At step 315, the quality of the GPS measurements is evaluated and, if necessary, the values of N, A, and M are changed. For example, if the GPS signal is particularly poor then the values of N, A, and M are altered so that more readings are taken. At step 320, the location receiver is rotated counter clockwise until a mechanical end stop is reached. In other words, the location receiver is rotated counter clockwise as far as it will go. Once this end point is reached, the orientation of the location receiver 110 at this position is assigned an angle. In this embodiment, the assigned angle is −188 degrees because at the position of the mechanical stop, the location receiver 110 will be −188 degrees from the known point about the axis 130. Note that the mechanical stop may be in another position, provided the position is known in advance. At step 325, the antenna is then rotated by 8 degrees until it is at an angle of −180 degrees from the known point. At step 330, the variable n (the current rotation number) is initialised to 0. At step 335, it is determined whether or not n (the current rotation number) is less than N (the number of rotations to be performed). If not, then at step 340, the readings can be used to calculate the bearing offset, and the process completes at step 345. Alternative, if n is not less than N then at step 350, n is incremented by 1. The value a (the current angle of rotation) is initialised to −180 degrees at step 355. At step 360, it is determined whether or not a (the current angle of rotation) is greater than 180 degrees. This represents the situation in which the location receiver has completed an entire rotation from −180 degrees to 180 degrees. If this is the case, then the process returns to step 335. Otherwise, the process proceeds to step 365 where m (the number of readings taken at this position) is initialised to 0. At step 370, m is incremented by one. At step 375, the longitude and latitude are determined from the GPS signal received by the location receiver 110. At step 380, it is determined whether or not m (the number of readings taken at this position) is less than M (the number of readings to take at each position). If so, then the process returns to step 370 where the value of m is incremented and another reading is taken. If not, then the process proceeds to step 385 where the value of a (the current angle of rotation) is incremented by the scanning resolution (A). At step 390, the location receiver 110 is rotated by A degrees and flow proceeds to step 360.

In effect, the flowchart shown in FIG. 6 represents a 3-nested loop. The outer-most loop (steps 330, 335, and 350) iterates through the number of rotations of the location receiver 110. Within each of those iterations, a second loop (steps 355, 360, and 385) iterates through each position at which a reading is to be taken. At each position, an innermost loop (steps 365, 370, and 380) iterates through the number of readings to be taken at each position. The process therefore collects a set of readings (the number of which is N×(2π/A)×M), which is passed through the multiplier 210 and integrate and dump filter 230 as illustrated previously with reference to FIG. 4.

Figure 7:
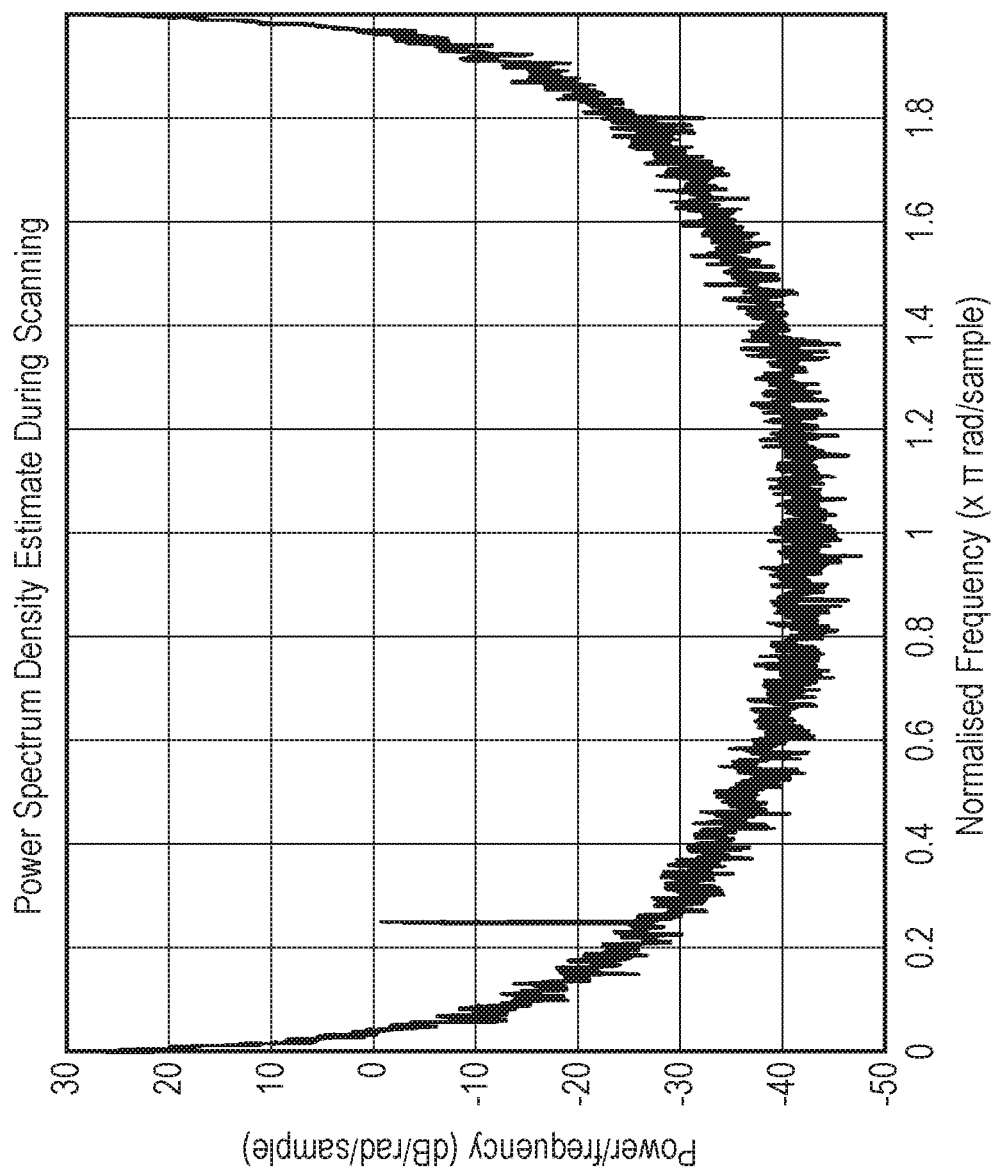
FIG. 7 illustrates a power spectrum density estimate of the position error obtained when using an apparatus in accordance with one embodiment.

FIG. 7 illustrates a power spectrum density graph for the measurements taken using the process described with reference to FIG. 6 when an angular resolution (A) of 45 degrees is used. As can be seen, a corresponding spectral peak appears at (0.25 π radians/sample), which corresponds with A. This suggests that the use of the correlator 240 that uses a multiplier 210 followed by an integrate and dump filter 230 will yield an accurate estimate of the value of θ (i.e. the bearing that the location receiver 110 makes with the known point 140 about the axis 130. Note that if the angular resolution was π radians then the spectral peak would appear at 1×π radians per sample.

Figure 8:
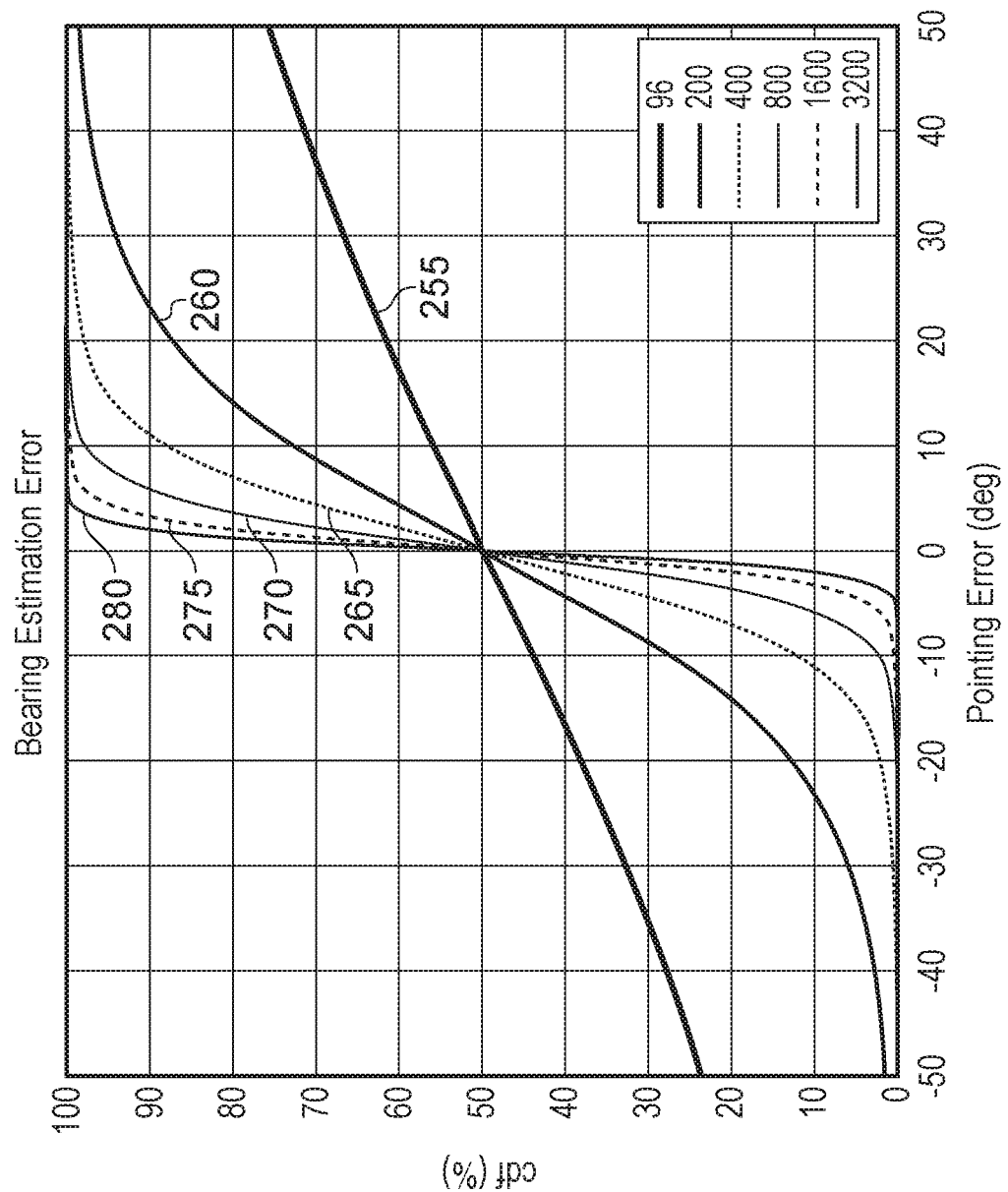
FIG. 8 is a graph showing how the bearing estimation error varies depending on the number of samples taken.

FIG. 8 illustrates a bearing estimation error for 96 readings (255), 200 readings (260), 400 readings (265), 800 readings (270), 1600 readings (275), and 3200 (280) readings. As shown, 90% of the time the bearing estimate is better than ±31.6, ±14.7, ±7.8, ±4.4, ±2.6 degrees, for 200, 400, 800, 1600, 3200 number of readings, respectively.

Figure 9:
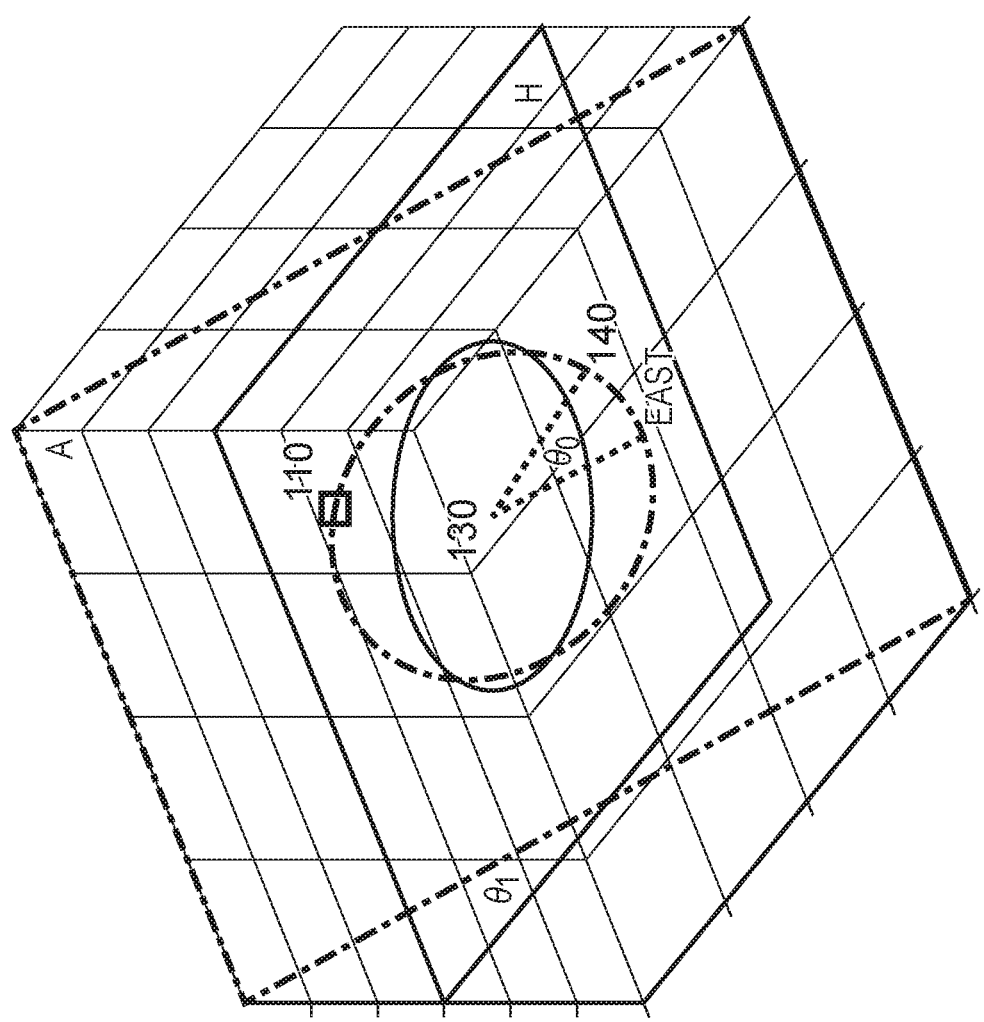
FIG. 9 is an example illustrating the difference between bearing and tilt.

Using a similar methodology to that described above, it is possible to determine both the absolute bearing of a known point 140 and also the tilt of the location receiver relative to the plane tangent to the Earth's surface at the location of the location receiver 110. The different angles involved can be seen with reference to FIG. 9. In the figure, H represents the horizontal plane, which is tangent to the Earth's surface at the location of the location receiver 110. In this example, A is a plane made by the rotation of the location receiver 110 around the axis 130. The rotation of the location receiver 110 around the axis 130 is shown by a dotted line. The angle of tilt $\theta_1$ is the angle between these two planes. Meanwhile, the absolute bearing of the known point 140 about the axis 130 is given by $\theta_0$. In this example, the absolute bearing is given with reference to true east. The solid circle illustrates the projection of the path taken by the location receiver 110 on to the plane H. This forms an ellipse.

There are a number of ways of determining both $\theta_0$ and $\theta_1$. In one embodiment, cost minimising circuitry may be used to perform a cost minimising function based on $\theta_0$ and $\theta_1$. For example, consider the following quadratic cost function:

$$C(\theta_0, \theta_1) = \sum_{k=0}^{k-1} |P_k - x_k(\theta_1)e^{j\theta_0}|^2$$

Where k is the number of readings, $P_k$ is location reading number k (as previously discussed), j is the unit imaginary number ($\sqrt{(-1)}$), $\varphi_k$ is the angle made by the location receiver 110 about the axis 130 at reading k and $x_k(\theta_1)=r[\cos(\varphi_k)+j\sin(\varphi_k)\cos(\theta_1)]$ denotes the trajectory of the ellipse. The aim is to minimise $C(\theta_0,\theta_1)$ with respect to $\theta_0$ and $\theta_1$. In other words, this method seeks to compute the absolute bearing and tilt estimates that best fit the received location data.

Minimizing $C(\theta_0,\theta_1)$ with respect to $\theta_0$ yields:

$$\hat{\theta}_0(\theta_1) = \angle \sum_{k=0}^{k-1} P_k x_k^*(\theta_1)$$

Where $\angle z$ denotes the angle of the complex number z and * refers to the complex conjugate. In other words, $x_k^*(\theta_1)=r[\cos(\varphi_k)-j\sin(\varphi_k)\cos(\theta_1)]$. In the above equation, it can be seen that $\hat{\theta}_0$ is a function of $\theta_1$. Substituting $\hat{\theta}_0(\theta_1)$ into $C(\theta_0,\theta_1)$ yields:

$$C(\hat{\theta}_0(\theta_1), \theta_1) = \sum_{k=0}^{k-1} |P_k - x_k(\theta_1)e^{j\angle\sum_{k=0}^{k-1}P_k x_k^*(\theta_1)}|^2$$

The least squared tilt estimate $\hat{\theta}_1$ is evaluated by firstly finding the minimum of $C(\hat{\theta}_0(\theta_1),\theta_1)$ and then the least square estimate of the absolute bearing angle $\hat{\theta}_0$ is derived via back substitution. Accordingly, the value of $\theta_1$ for which $C(\hat{\theta}_0(\theta_1),\theta_1)$ attains its minimum (arg min) is computed by:

$$\hat{\theta}_1 = \underset{\theta_1}{\operatorname{argmin}} \sum_{k=0}^{k-1} |P_k - x_k(\theta_1)e^{j\angle\sum_{k=0}^{k-1}P_k x_k^*(\theta_1)}|^2$$

And the least squared estimate of $\theta_0$ is given by:

$$\hat{\theta}_0 = \angle \sum_{k=0}^{k-1} P_k x_k^*(\hat{\theta}_1)$$

Figure 10:
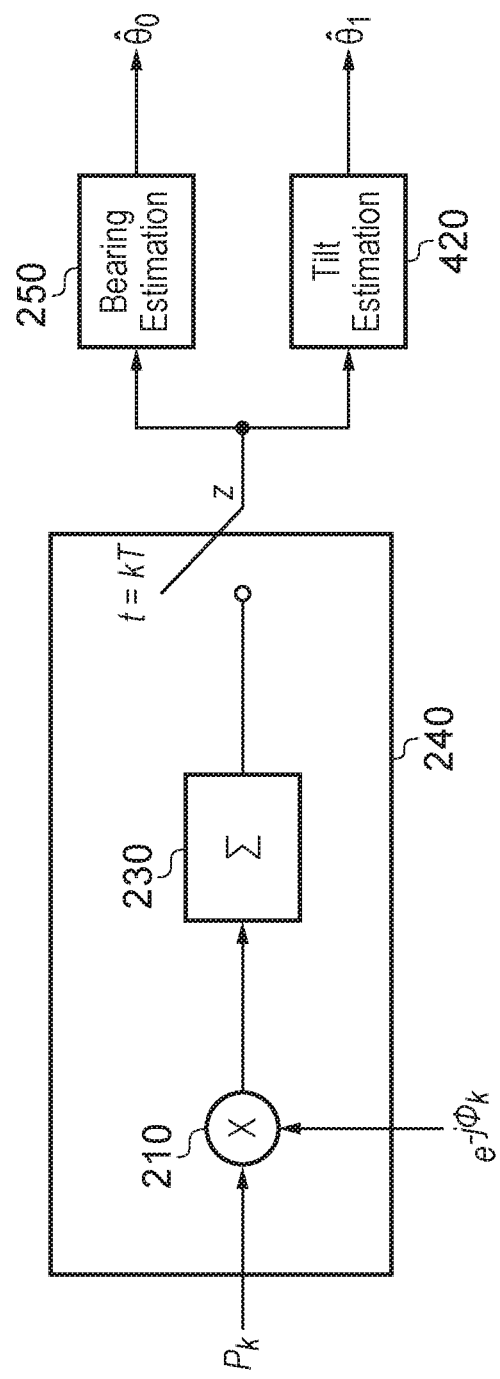
FIG. 10 schematically illustrates calculation circuitry in accordance with one embodiment.

Another way to determine both the absolute bearing and tilt is schematically illustrated by the calculation circuitry 400 shown in FIG. 10. In this circuitry, after the accumulate the dump filter 230, the result z is passed to bearing estimation circuitry 250 to determine the absolute bearing as previously discussed, as well as tilt estimation circuitry 420, which is used to determine the tilt. The tilt estimation circuitry determines the tilt based on a function of the magnitude of z. In particular, as previously discussed:

$$z = \sum_{k=0}^{k-1} P_k e^{-j\varphi_k}$$

Assuming that $\varphi_k$ is sampled uniformly in a circle then by performing trigonometric and algebraic manipulation, it can be shown that:

$$z = \frac{k}{2}re^{j\theta_0}(1+\cos(\theta_1)) + n$$

Where n again represents a noise component. The bearing and tilt estimates are therefore given by:

$$\hat{\theta}_0 = \angle z$$

$$\hat{\theta}_1 = \begin{cases} \cos^{-1}\left(\frac{2}{rk}|z|-1\right), & \text{if } |z| < \frac{rk}{2} \\ 0, & \text{otherwise} \end{cases}$$

This method may be less computationally expensive than using the previously described cost minimising circuitry.

Figure 11A:
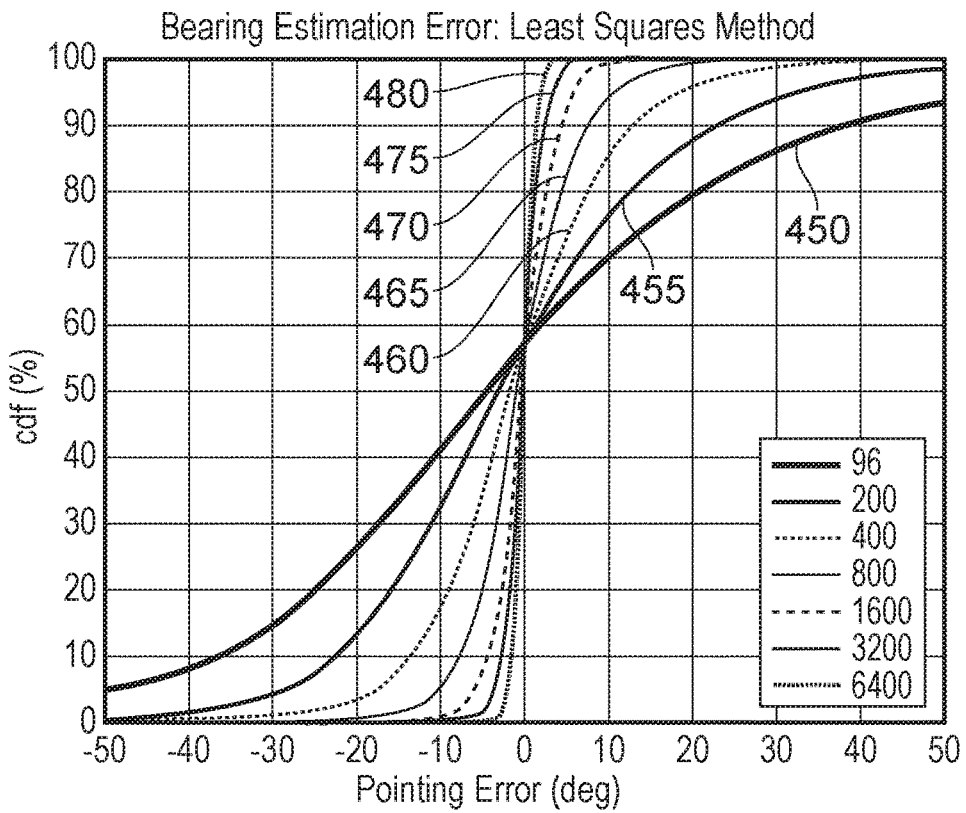
FIGS. 11A, 11B, 11C and 11D are graphs showing how bearing and tilt estimation errors vary depending on the number of samples taken.
Figure 11C:
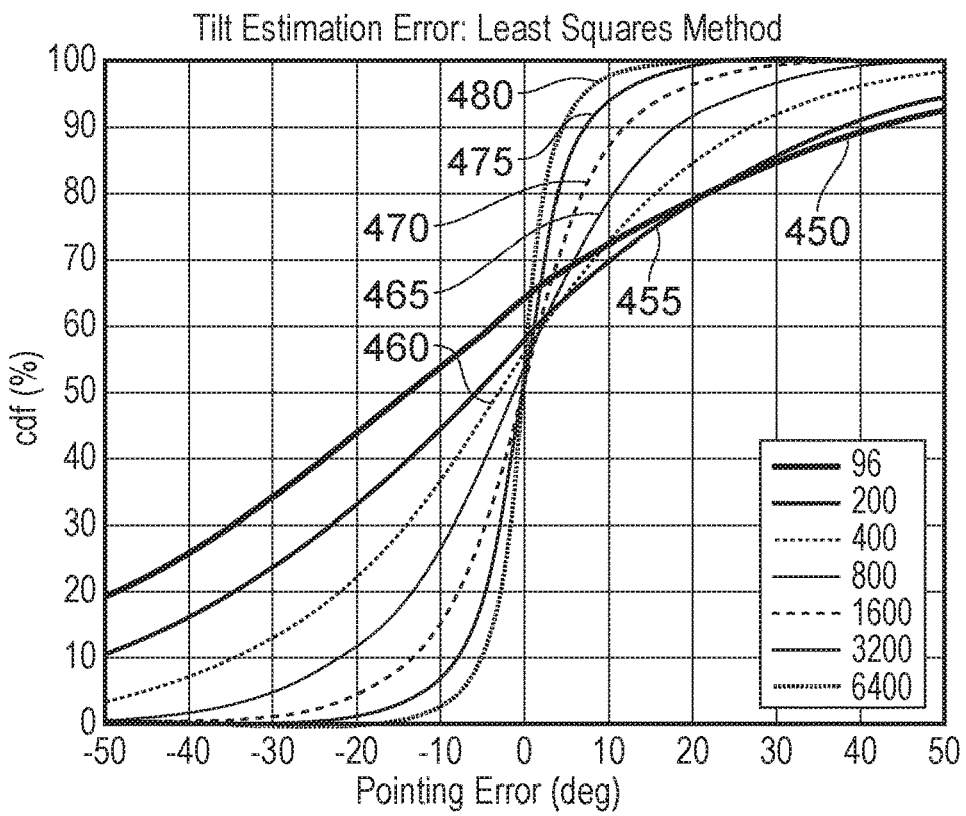
Figure 11B:
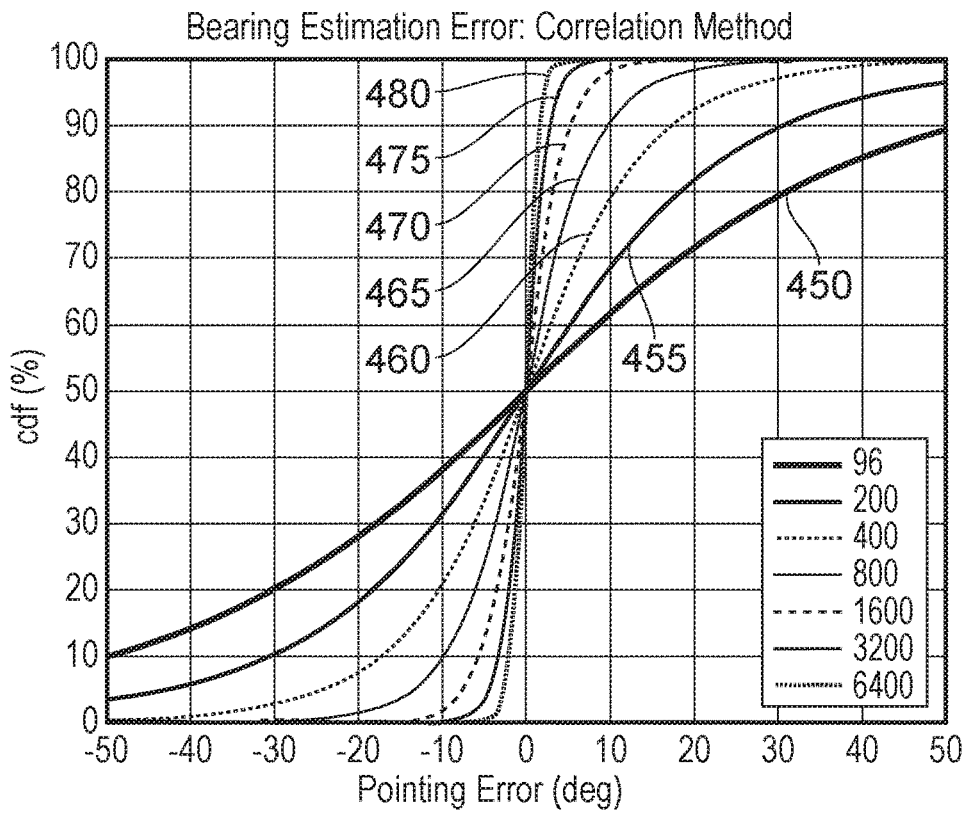
Figure 11D:
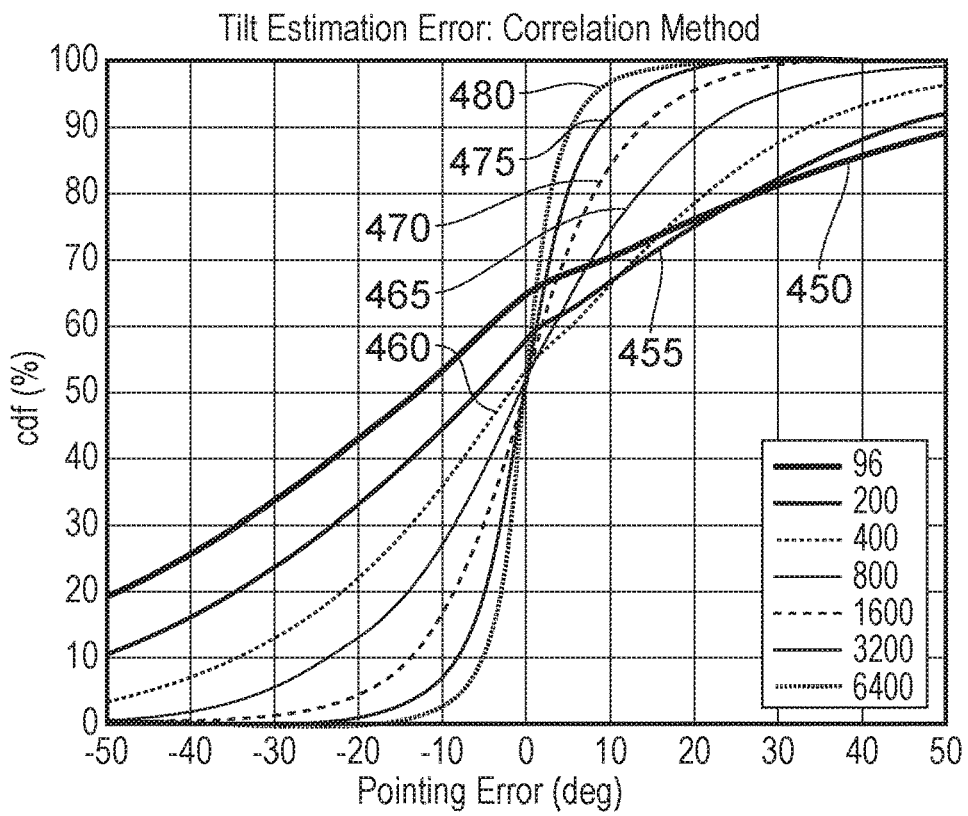

FIGS. 11A-11D illustrate the quality of the angle estimates as a function of the number of samples (k) using each of the two methods for determining absolute bearing and tilt. In particular, the figures show the pointing error, in degrees, as a cumulative density function for 96 samples (450), 200 samples (455), 400 samples (460), 800 samples (465), 1600 samples (470), 3200 samples (475), and 6400 samples (480). FIG. 11A illustrates the absolute bearing error when using the least squares (cost minimisation) method. FIG. 11B illustrates the absolute bearing error when using the correlation method (e.g. when using the bearing estimation circuitry and tilt estimation circuitry illustrated in the embodiment of FIG. 10). FIG. 11C illustrates the tilt error when using the least squares (cost minimisation) method and FIG. 11D illustrates the tilt error when using the correlation method (e.g. when using the bearing estimation circuitry and tilt estimation circuitry illustrated in the embodiment of FIG. 10). The figures show that getting absolute bearing and tilt estimates using the computationally simpler correlation method still yields satisfactory results.

Figure 12:
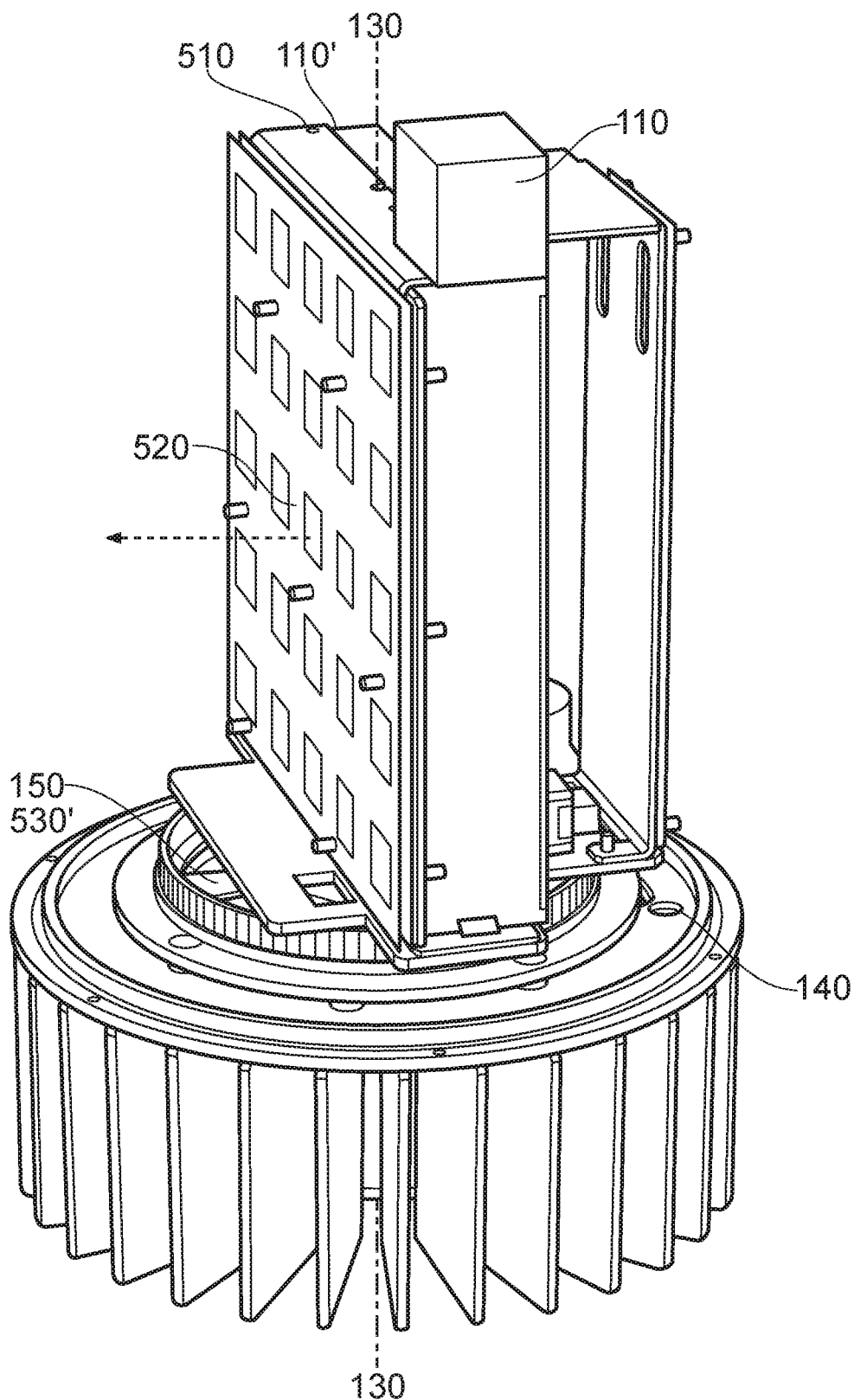
FIG. 12 is a diagram illustrating an example of an apparatus comprising an antenna array in accordance with one embodiment.

FIG. 12 illustrates an embodiment in which the apparatus 500 additionally comprises an antenna array 510 defining a reference plane 520. The axis 130 is a longitudinal axis of the antenna array 510 and the rotation mechanism 120 rotates the antenna array 510 about this axis. The location receiver 110 is directly attached to the antenna array 520 at a position that is offset from the axis 130 such that rotation of the antenna array 510 about its axis 130 causes the location receiver 110 to rotate about the axis 130 at a radius. Calculation circuitry 150 and an antenna bearing calculation unit 530 are included within the main assembly. The calculation unit 150 determines the absolute bearing and/or tilt of the apparatus 500 as previously discussed. The antenna bearing calculation unit 530 can be used to determine the absolute bearing of the reference plane 520 based on an absolute bearing of the known point 140 about the axis 130, and an angle of the location receiver 110 about the axis 130 from the known point 140 together with knowledge of a position at which the location receiver 110 is directly or indirectly mounted to the antenna assembly 510. For example, if it is known that the known point 140 is 45 degrees clockwise of true east and if it is known that the location receiver 110 is 45 degrees clockwise of the known point 140 then it is known that the location receiver is 90 degrees clockwise of true east. If it is also known that the location receiver is mounted as illustrated in FIG. 12, then it can be known that the direction perpendicular to the reference plane 520 (illustrated by the dashed line in FIG. 12) is 90 degrees clockwise of the angle of the location receiver 110, in other words, that the reference plane faces 180 degrees from true east (i.e. true west). If the location receiver 110 were mounted on the other side of the antenna array 510 at 110' then it would be known that the reference plane 520 faces an angle 90 degrees anti-clockwise of the angle of the location receiver 110. Accordingly, the true bearing of the antenna array 510 can be determined. It will be appreciated that a similar technique may also be used to determine the tilt of the antenna array 510.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. An apparatus comprising:
a location receiver to receive a signal indicative of a location of the location receiver;
a movement mechanism to rotate the location receiver about an axis and to provide an angle of the location receiver about the axis from a known point of the apparatus, wherein an absolute bearing of the known point about the axis is initially unknown; and
calculation circuitry to calculate an output value indicative of the absolute bearing of the known point about the axis, based on a plurality of given angles of the location receiver about the axis from the known point, and a plurality of associated locations of the location receiver indicated by the signal received when the location receiver is at each of the given angles.

2. An apparatus according to claim 1, the apparatus further comprising:
a noise filter, wherein
the signal indicative of the location of the location receiver comprises a noise component; and
the noise filter is to filter out the noise component.

3. An apparatus according to claim 2, wherein
the noise filter is a low-pass filter.

4. An apparatus according to claim 1, wherein the calculation circuitry comprises:
a correlator to correlate the angle of the location receiver about the axis from the known point and output a correlation result; and
a phase angle extractor to produce the output value from the correlation result.

5. An apparatus according to claim 4, wherein the correlator comprises:
a multiplier to multiply the location of the location receiver by $e^{-j\varphi}$, where j is the unit imaginary number and $\varphi$ is the angle of the location receiver about the axis from the known point with which the location is associated, and to output a plurality of multiplication results; and
an integrate and dump filter to operate on the plurality of multiplication results.

6. An apparatus according to claim 1, wherein
the absolute bearing of the known point about the axis is a bearing of the known point about the axis relative to true east.

7. An apparatus according to claim 6, wherein
the signal is a navigation system signal.

8. An apparatus according to claim 7, wherein
the signal is a satellite based global navigation system signal.

9. An apparatus according to claim 8, wherein
the signal is a GPS signal.

10. An apparatus according to claim 8, wherein
the location receiver is to receive a further signal indicative of a location of the location receiver; and
the further signal is a ground based global navigation system signal.

11. An apparatus according to claim 1, wherein
the signal is indicative of a longitude and latitude of the location receiver.

12. An apparatus according to claim 1, the apparatus further comprising:
an antenna assembly to perform at least one of receiving or transmitting a further signal, wherein
the antenna assembly defines a reference plane;
the movement mechanism is to rotate the antenna assembly about the axis;
the location receiver is directly or indirectly mounted to the antenna assembly at a distance from the axis equal to the radius such that when the movement mechanism rotates the antenna assembly about the axis, the location receiver rotates about the axis.

13. An apparatus according to claim 12, the apparatus further comprising:
an antenna bearing calculation unit to determine an indication of an absolute bearing of the reference plane based on an absolute bearing of the known point about the axis, an angle of the location receiver about the axis from a known point and a position at which the location receiver is directly or indirectly mounted to the antenna assembly.

14. An apparatus according to claim 13, wherein
the indication of the absolute bearing of the reference plane is a vector perpendicular to the reference plane.

15. An apparatus according to claim 12, wherein
the axis is perpendicular to the reference plane; and
the axis passes through a mid-point of the antenna assembly.

16. An apparatus according to claim 1, wherein the axis is upright.

17. An apparatus according to claim 1, wherein the calculation circuitry is to produce the output value and a further output value indicative of a tilt of the location receiver, additionally based on a radius between the location receiver and the axis.

18. An apparatus according to claim 17, wherein the calculation circuitry comprises cost minimising circuitry to calculate the output value and further output value by performing a cost minimising function.

19. An apparatus according to claim 18, wherein the cost minimising function is based on a least squares estimate of the output value and the further output value.

20. An apparatus according to claim 17, wherein the calculation circuitry comprises:
- a correlator to correlate the angle of the location receiver about the axis from a known point and output a correlation result;
- a phase angle extractor to produce the output value from the correlation result; and
- a tilt estimator to produce the further output value based on a magnitude of the correlation result.

21. A method of operating an apparatus, the method comprising the steps:
- receiving a signal indicative of a location of a location receiver;
- rotating the location receiver about an axis;
- providing an angle of the location receiver about the axis from a known point of the apparatus, wherein an absolute bearing of the known point about the axis is initially unknown; and
- calculating an output value indicative of the absolute bearing of the known point about the axis, based on a plurality of given angles of the location receiver about the axis from the known point, and a plurality of associated locations of the location receiver indicated by the signal received when the location receiver is at each of the given angles.

22. An apparatus comprising:
- means for receiving a signal indicative of a location of the location receiver;
- means for rotating the location receiver about an axis;
- means for providing an angle of the location receiver about the axis from a known point of the apparatus, wherein an absolute bearing of the known point about the axis is initially unknown; and
- means for calculating an output value indicative of an absolute bearing of the known point about the axis, based on a plurality of given angles of the location receiver about the axis from the known point, and a plurality of associated locations of the location receiver indicated by the signal received when the location receiver is at each of the given angles.

* * * * *